US008546684B2

(12) United States Patent
Nojima et al.

(10) Patent No.: US 8,546,684 B2
(45) Date of Patent: Oct. 1, 2013

(54) ORGANIC PHOTOELECTRIC CONVERSION ELEMENT AND ORGANIC PHOTOELECTRIC CONVERSION ELEMENT MANUFACTURING METHOD (75) Inventors: Takahiko Nojima, Tokyo (JP); Yasushi Okubo, Hino (JP); Hiroaki Itoh, Hachioji (JP); Ayako Wachi, Hino (JP)

(73) Assignee: Konica Minolta Holdings, Inc. (JP)

( * ) Notice: Subject to any disclaimer, the term of this patent is extended or adjusted under 35 U.S.C. 154(b) by 88 days.

(21) Appl. No.: 13/123,819

(22) PCT Filed: Oct. 7, 2009

(86) PCT No.: PCT/JP2009/067494
§ 371 (c)(1),
(2), (4) Date: Apr. 12, 2011

(87) PCT Pub. No.: WO2010/044364
PCT Pub. Date: Apr. 22, 2010

(65) Prior Publication Data
US 2011/0197966 A1    Aug. 18, 2011

(30) Foreign Application Priority Data
Oct. 15, 2008 (JP) ................................. 2008-266138

(51) Int. Cl.
*H01L 31/00* (2006.01)
(52) U.S. Cl.
USPC ....................................................... 136/256
(58) Field of Classification Search
USPC ................... 136/256; 257/E31.124; 977/948
See application file for complete search history.

(56) References Cited

U.S. PATENT DOCUMENTS

| 5,331,183 | A | 7/1994 | Sariciftci et al. |
| 2006/0147723 | A1* | 7/2006 | Jing et al. ........................ 428/421 |
| 2007/0074316 | A1 | 3/2007 | Alden et al. |
| 2008/0143906 | A1* | 6/2008 | Allemand et al. ............... 349/43 |

FOREIGN PATENT DOCUMENTS

| JP | 6-80422 A | 3/1994 |
| JP | 6-273964 A | 9/1994 |
| JP | 8-500701 A | 1/1996 |
| JP | 2003-331654 A | 11/2003 |
| JP | 2006-519712 T | 8/2006 |
| WO | 94/05045 A1 | 3/1994 |
| WO | 2004/069736 A2 | 8/2004 |

OTHER PUBLICATIONS

Kim, Hwa-Min et al., "Electronic and Optical Properties of Indium Zin Oxide Thin Films Prepared by Using Nanopowder Target", Apr. 20, 2011, Japanese Journal of Applied Physics, 50, 045801, pp. 1-5.*
Lee, W.H. et al., "Exploiting optical properties of P3HT:PCBM films for organic solar cells with semitransparent anode", 2010, Thin Solid Films, 518, pp. 7450-7454.*
International Search Report for International Application No. PCT/JP2009/067494 with English translation mailed on Jan. 12, 2010.

* cited by examiner

*Primary Examiner* — Jonathan Johnson
*Assistant Examiner* — Tamir Ayad
(74) *Attorney, Agent, or Firm* — Cantor Colburn LLP (57) ABSTRACT Provided is an organic photoelectric conversion element having a high photoelectric conversion ratio. Provided is also a method for manufacturing an organic photoelectric conversion element which can significantly reduce the manufacturing cost by forming a transparent electrode and an organic generation layer portion by coating a material. The organic photoelectric conversion element includes on a transparent substrate, a first electrode unit having a transparent conductive layer, an organic generation unit, and a second electrode unit which are successively arranged in this order when viewed from the transparent substrate. The transparent conductive layer constituting the first electrode unit contains conductive fiber and transparent conductive material.

7 Claims, 2 Drawing Sheets

ORGANIC PHOTOELECTRIC CONVERSION ELEMENT AND ORGANIC PHOTOELECTRIC CONVERSION ELEMENT MANUFACTURING METHOD

CROSS REFERENCE TO RELATED APPLICATIONS

This is a U.S. national stage application of International Application No. PCT/JP2009/067494, filed on 7 Oct. 2009. Priority under 35 U.S.C. §119(a) and 35 U.S.C. §365(b) is claimed from Japanese Application No. JP2008-266138, filed 15 Oct. 2008, the disclosure of which is also incorporated herein by reference.

TECHNICAL FIELD

The present invention relates to an organic photoelectric conversion element, and in more detail, the present invention relates to an organic photoelectric conversion element which is excellent in power generation efficiency by using a transparent electrode with high conductivity, transparency, and a suitable haze value. Furthermore, the present invention relates a production method of the organic photoelectric conversion element by which a production cost can be significantly reduced by producing a transparent electrode and an organic power generation layer unit with a coating method.

BACKGROUND

In recent years, since an organic thin film solar cell which is made of an organic photoelectric conversion element can be formed by a coating method, it has been attracted attention as a solar cell suitable for mass production, and intensive investigation has been made in many research institutions. The organic thin film solar cell was improved in a charge separation efficiency which had been a problem by adopting what is called a bulk heterojunction structure in which an electronic donor material and an electronic acceptor material were mixed (for example, refer to Patent document 1). In recent years, the photoelectric conversion efficiency was improved to achieve to an extent of 5 to 6%, and it can be said that the investigations towards a practical application has been activated more. However, in the organic photoelectric conversion element towards a future practical application, development of the organic photoelectric conversion element which generates electricity at higher efficiency is desired.

Moreover, when manufacturing an organic thin film solar cell with a coating process using a flexible substrate, it is possible to manufacture an inexpensive solar cell with a low manufacturing cost which cannot be realized with the conventional silicone system solar cell by applying coating process so called a roll to roll production process. However, for the purpose of practical realization, development of an inexpensive and highly efficient flexible transparent electrode substrate is one of the key investigational works.

Conventionally, as a transparent electrode, there has been mainly used an ITO transparent electrode having an indium-tin complex oxide (ITO) membrane produced by a vacuum deposition method or a sputtering process on transparent base materials, such as glass and a transparent plastic film. However, it was problems that the transparent electrode formed using a vacuum deposition method or sputtering process has inferior manufacturing efficiency, and the manufacturing cost is high and that it is inapplicable to the device application in which a flexible property is required since it is inferior to flexibility.

In order to solve this problem, it was proposed a method to form a transparent electrode by coating metal oxide particles such as ITO (for example, refer to Patent document 2.). However, it remained a problem that sufficient conductivity for functioning as an electrode could not be acquired. Although it is possible to lower electrical resistance by carrying out baking treatment of the coated film of metal oxide particles, this treatment cannot be applied, when a transparent electrode is formed on a resin base material like a plastic film.

Moreover, as a method of forming a transparent electrode excellent in manufacturing efficiency, there was proposed a method for forming a transparent electrode with a wet coating method or with a printing method using a coating liquid which dissolved or dispersed a conductive polymer represented by pi conjugated polymer in a suitable solvent as the production way of a transparent electrode (for example, refer to Patent document 3.). However, the transparent electrode obtained by the method proposed in Patent document 3 had a problem that conductivity was lower and also clarity was inferior compared with a metal oxide transparent electrode such as ITO formed by a vacuum film formation method.

There is disclosed a technique using an electro conductive fiber like a carbon nanotube (CNT) or a metal nanowire. Here, fixing a part of an electro conductive fiber is fixed to a substrate with a transparent resin layer, and a part of the electro conductive fiber is projected on the surface of the transparent resin layer to result in forming an electrode (for example, refer to Patent documents 4 and 5). However, since the electrode of such composition has electro conductivity only in the part from which the electro conductive fiber is projected on the surface, it does not have a function as a flat electrode. In addition, since the electro conductive fiber is projected on the surface and too much electrical resistance will be loaded on the projected part, the deterioration from a projected part will occur and this method had the problem that the durability of the whole element was inferior.

PRIOR ART DOCUMENTS

Patent Documents
  Patent document 1: U.S. Pat. No. 5,331,183
  Patent document 2: Japanese Patent Application Publication (JP-A) No. 6-80422
  Patent document 3: JP-A No. 6-273964
  Patent document 4: Japanese Translation of PCT International Application Publication No. 2006-519712
  Patent document 5: US 2007/0074316 A1

SUMMARY OF THE INVENTION

Problems to be Solved by the Invention

An object of the present invention is to provide an organic photoelectric conversion element which is excellent in power generation efficiency, and also to provide a production method of the organic photoelectric transducer which can significantly reduce a manufacturing cost by manufacturing a transparent electrode and an organic power generation layer unit with a coating method.

Means to Solve the Problems

The above problems related to the present invention can be solved by the following embodiments.
1. An organic photoelectric conversion element comprising a transparent substrate provided thereon a first electrode unit having a transparent electro conductive layer, an organic power generation layer unit, and a second electrode unit which are successively arranged in the order of proximity to the transparent substrate, wherein the transparent electro conductive layer composing the first electrode unit comprises an electro conductive fiber and a transparent electro conductive material.

2. The organic photoelectric conversion element of the aforesaid item 1, wherein the electro conductive fiber is a metal nanowire.

3. The organic photoelectric conversion element of the aforesaid items 1 or 2, wherein the first electrode unit comprises at least two layers each containing a metal nanowire.

4. The organic photoelectric conversion element of the aforesaid item 3, wherein average haze values EH1 and EH2 satisfy the relationship of: EH1<EH2, provide that, among the at least two layers each containing a metal nanowire in the first electrode, the layer located at near the transparent substrate has the average haze value of EH1, and the layer located at near the organic power generation layer unit has the average haze value of EH2.

5. The organic photoelectric conversion element of any one of the aforesaid items 1 to 4, wherein the first electrode comprises a metal nanowire as an electro conductive fiber, a first transparent resin component, and a second transparent resin component which has a higher refractive index than the first transparent resin component; the first transparent resin component is contained with a higher content in a region near the transparent substrate; and the second transparent resin component and the metal nanowire are contained with a higher content in a region near the organic power generation layer unit.

6. The organic photoelectric conversion element of the aforesaid item 5, wherein the second transparent resin component is a transparent conductive polymer.

7. The organic photoelectric conversion element of any one of the aforesaid items 1 to 4, wherein the first electrode comprises a metal nanowire as an electro conductive fiber, a first transparent resin component, and a transparent inorganic component which has a higher refractive index than the first transparent resin component; the first transparent resin component is contained with a higher content in a region near the transparent substrate; and the transparent inorganic component and the metal nanowire are contained with a higher content in a region near the organic power generation layer unit.

8. The organic photoelectric conversion element of the aforesaid item 7, wherein the transparent inorganic component is a transparent conductive metal oxide.

9. The organic photoelectric conversion element of any one of the aforesaid items 5 to 8, wherein a particle co-exists in a region where the first transparent resin component is located.

10. The organic photoelectric conversion element of any one of the aforesaid items 1 to 9, wherein the second electrode unit contains a metal compound as a constituting component the second electrode unit.

11. A method for producing the organic photoelectric conversion element of any one of the aforesaid items 1 to 10, comprising the steps of forming the transparent electro conductive layer containing the electro conductive fiber and the transparent electro conductive material on a mold-releasing substrate; then transferring the transparent electro conductive layer on the transparent substrate to form the first electrode unit 12. A method for producing the organic photoelectric conversion element of any one of the aforesaid items 5 to 10, comprising the steps of forming a layer A containing the first transparent resin component on the transparent substrate; then transferring a layer B containing the electro conductive fiber and the second transparent resin component which have been formed on a mold-releasing substrate, or a layer C containing the electro conductive fiber and the transparent inorganic component which have been on a mold-releasing substrate onto the layer A containing the first transparent resin component to form the first electrode unit.

Effects of the Invention

By the present invention, it was possible to provide an organic photoelectric conversion element which is excellent in power generation efficiency, and it was also possible to provide a production method of the organic photoelectric transducer which can significantly reduce a manufacturing cost by manufacturing a transparent electrode and an organic power generation layer unit with a coating method.

EMBODIMENTS TO CARRY OUT THE INVENTION

Hereafter, the preferred embodiments for carrying out the present invention will be described in details.

The present inventors investigated a transparent electro conductive electrode which can be produced with a coating method and to resolve the problems of improving efficiency of an organic photoelectric conversion element. As a result, the present inventors achieved the following invention. In an organic photoelectric conversion element containing on a transparent substrate a first electrode unit having a transparent electrode, an organic power generation layer unit and a second electrode unit which are successively arranged in the order of near the transparent substrate, it is possible to realize an organic photoelectric conversion element having a high photoelectric conversion efficiency by the following structure. Namely, an organic photoelectric conversion element of the present invention is characterized in that a transparent electro conductive layer composing the aforesaid first electrode unit contains: an electro conductive fiber; and a transparent electro conductive material. Furthermore, it was found the production method of an organic photoelectric conversion element which can significantly reduce the production cost by producing the transparent electrode and the organic power generation layer unit with a coating method. Thus, the present invention was achieved.

The present inventors guessed as follows the reason of obtaining the required effects of the present invention by taking the composition specified by the present invention.

In an organic photoelectric conversion element, it is often used ITO (Indium Tin Oxide: tin added indium oxide) as a transparent electrode. Although the haze value of a transparent electrode can be changed by controlling the texture of the surface of ITO, when the texture structure is made coarse in order to raise the haze value, the ITO surface roughness becomes large and the actual situation is that it is easy to produce short-circuit since the coating thickness of the organic power generation layer unit composed of a power generation layer is very thin in an order of a few hundred nanometers.

That is, by incorporating a transparent electro conductive layer having a smooth surface and having a haze value specified in the present invention, it is possible to control the light scattering at the transparent substrate, the electrode, the organic power generation layer unit and interface of each film. In addition, by incorporation the metal nanowire contained in the first electrode unit at the portion near the organic power generation layer unit (the power generation layer), it is possible to provide a layer having a high haze value and being easy to produce light scattering. Thus, the optical length of the incident light becomes long and an amount of light scattering which arrives at the power generation layer will be increased, and as a result, it is assumed that the photoelectric conversion efficiency will be improved.

Hereafter, these will be described in details.

An organic photoelectric conversion element of the present invention is characterized in that it comprises a transparent substrate provided thereon a first electrode unit having a transparency of light, an organic power generation layer unit, and a second electrode unit which are successively arranged in this order when viewed from the transparent substrate.

An organic power generation layer unit described in the present invention indicates, in addition to an organic power generation layer, a variety of functional layers exhibiting a hole transporting property, an electron transporting property, a hole blocking property and an electron blocking property when they are jointly used with an organic power generation layer.

In the present invention, a first electrode unit having a transparent electro conductive layer is provided with a transparent electro conductive layer containing a light transmitting electro conductive fiber and a transparent electro conductive material on a transparent substrate. The first electrode unit of the present invention is composed of a material having electro conductivity and a resin to hold this material. Furthermore, functional layers such as an adhesion assisting layer, an antistatic layer, and a barrier layer which are provided beforehand on the transparent substrate are considered as a part of the transparent substrate and they are not included in the first electrode unit of the present invention.

In the present invention, a second electrode unit is a layer provided on an organic power generation layer unit which contains an electro conductive material. Although the second electrode unit may be a layer consisting of an electro conductive material alone, when a resin to hold the electro conductive material is jointly used in addition to the electro conductive material, the second electrode unit of the present invention is designated to include this resin with the electro conductive material.

In the organic photoelectric conversion element of the present invention, when the first electrode unit comprises two or more layers each containing a metal nanowire, it is preferable that the average haze values EH1 and EH2 of two or more layers satisfy the relationship of EH1<EH2, provide that the layer located at near the transparent substrate has the average haze value of EH1, and the layer located at near the to organic power generation layer unit has the average haze value of EH2.

More specifically, when the two or more layers containing a metal nanowire and constituting the first electrode unit is divided in one half of the coating thickness position, it is preferable that the average haze values EH1 and EH2 satisfy the relationship of: EH1<EH2, provide that the average haze value in the portion of the one half of the coating thickness near the transparent substrate is EH1, and the average haze value in the portion of the one half of the coating thickness near the organic power generation layer unit is EH2. These haze values are the mean value calculated from the haze values measured at 50 points randomly selected in each portion by making a surface with slanting cut, for example.

As an average haze value of EH1, it is desirable that it is 1.0 or more and 15 or less. As an average haze value of EH2, it is desirable that it is 3.0 or more and 50 or less. Moreover, as a difference EH2-EH1, it is desirable that it is 4.0 or more and 40 or less.

Measurement of these haze values can be measured using ASTM-D 1003-52 and haze meter HGM-2B made by Suga Test Instruments Co., Ltd., for example.

[Transparent Substrate]

A transparent substrate used as a transparent electrode concerning the present invention, there is no specific limitation as long as it has a high light transmittance. Although a glass substrate, a resin substrate, and a resin film are cited suitably for the transparent substrate since they are excellent in hardness as a substrate and also they are easily provided with an electro conductive layer on the surface thereof, it is preferable to use a transparent resin film from the viewpoints of lightness and flexibility.

In the present invention, there is no restriction in particular to the transparent resin film which can be preferably used as a transparent substrate, and it can be suitably chosen from the known materials with respect to form, structure and thickness. Specific examples of a resin film include: a polyester resin film such as polyethylene terephthalate (PET) and polyethylene naphthalate (PEN) and modified polyester; a polyolefin resin film such as a polyethylene (PE) resin film, a polypropylene (PP) resin film, a polystyrene resin film and a cyclic olefin resin; a vinyl resin film such as polyvinylchloride and polyvinylidene chloride; a polyether ether ketone (PEEK) resin film, a polysulfone (PSF) resin film, a polyethersulfone (PES) resin film, a polycarbonate (PC) resin film, a polyamide resin film, a polyimide resin film, an acrylic resin film and a triacetyl cellulose (TAC) resin film. If the resin film exhibits transmittance for the light of a visible range (380 to 800 nm) is 80% or more, it is preferably applicable to the transparent resin film concerning the present invention. Especially, from the viewpoints of transparency, heat resistivity, ease of handling, strength and cost, the following resins are preferable: a biaxial stretching polyethylene terephthalate film, a biaxial stretching polyethylene naphthalate film, a polyethersulfone film and a polycarbonate film. Among them, a biaxial stretching polyethylene terephthalate film and a biaxial stretching polyethylene naphthalate film are more preferable.

In order to secure the wettability and the adhesion property of a coating solution, surface treatment can be performed and an adhesion assisting layer can be prepared to the transparent substrate used for the present invention. About surface treatment or an adhesion assisting layer, a well-known technique can be used conventionally. For example, as surface treatment, there can be cites a surface activation process such as: corona discharge treatment, flame treatment, ultraviolet treatment, high-frequency treatment, glow discharge process, activity plasma treatment and laser process. Moreover, as an adhesion assisting layer, there can be cites: polyester, polyamide, polyurethane, vinyl system copolymer, butadiene system copolymer, acrylic system copolymer, vinylidene system copolymer and epoxy system copolymer. Although an adhesion assisting layer may be a single layer, it may be a composition of two or more layers in order to improve the adhesion property. A barrier coat layer may be formed beforehand to the transparent substrate, and a hard coat layer may be formed beforehand on the opposite side of the transparent substrate which is provided with a transparent first electrode unit.

[First Electrode Unit]

The first electrode unit containing a transparent electro conductive layer becomes an anode in the organic photoelectric conversion element.

Figure 1:
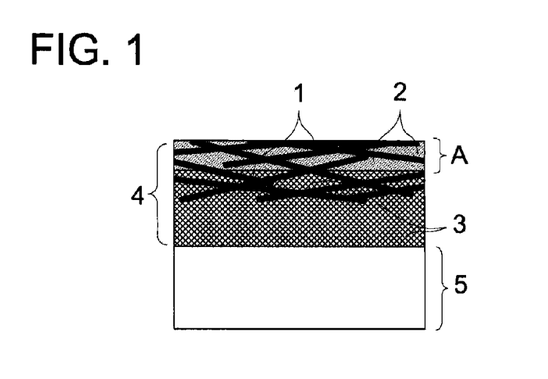
FIG. 1 is a structural schematic drawing showing an example of the first electrode unit in which the metal nanowire concerning the present invention exists ranging over two layers.

FIG. 1 is a structural schematic drawing showing an example of the first electrode unit in which the metal nanowire concerning the present invention exists ranging over two layers.

As an example of the first electrode unit 4 concerning the present invention, there is provided on a transparent substrate 5, an electro conductive fiber, for example, a metal nanowire 1 which is located in both a transparent electro conductive layer A and a layer composed of a first transparent resin 3. The transparent electro conductive layer A is composed of at least the metal nanowire 1; and a transparent electro conductive material 2 made of the second transparent resin component or the transparent inorganic component.

In an example shown in FIG. 1, the transparent electro conductive layer A is provided with the transparent electro conductive material 2 existing in a space located at the surface side of the electrode of a three dimensional mesh structure (an electro conductive network structure) formed by the metal nanowire 1. The metal nanowire 1 constitutes the surface of the electrode together with the transparent electro conductive material 2, and at the same time, the metal nanowire 1 can work as an auxiliary electrode to the transparent electro conductive material 2. Further, from the portion of the space in the three dimensional mesh structure formed by the metal nanowire 1 facing to the transparent substrate 5 to the transparent substrate 5, there exists the first transparent resin 3, and it fixes the transparent substrate 5 with containing a part of the metal nanowire 1.

Figure 2:
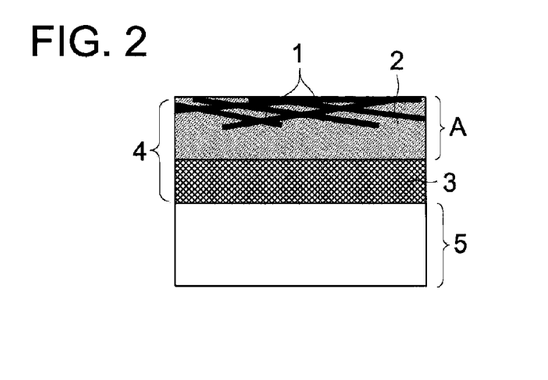
FIG. 2 is a structural schematic drawing showing an example of the first electrode unit in which the metal nanowire concerning the present invention exists in a single layer

FIG. 2 is a structural schematic drawing showing an example of the first electrode unit in which the metal nanowire concerning the present invention exists in a single layer In the structure described in FIG. 2, the metal nanowire 1 is located only in the transparent electro conductive layer A, and the transparent electro conductive material 2 is located in such a manner to completely comprehend the three dimensional mesh structure formed by the metal nanowire 1. The metal nanowire 1 constitutes the surface of the electrode together with the transparent electro conductive material 2, and at the same time, the metal nanowire 1 can work as an auxiliary electrode to the transparent electro conductive material 2. Further, in the portion between the transparent electro conductive layer A and the transparent substrate 5, there exists the first transparent resin 3, and it fixes the trans-parent electro conductive layer A containing the metal nanowire 1 to the transparent electro conductive layer A.

In an organic photoelectric conversion element of the present invention, the total optical transmittance of the first electrode unit 4 is preferably at least 60%, it is more preferably at least 70%, but it is still most preferably at least 80%. It is possible to determine the total optical transmittance based on the methods known in the art, employing a spectrophotometer. Further, the electrical resistance value of the first electrode unit is preferably at most 50Ω/□, it is more preferable to be at most 100Ω/□, and it is specifically preferable to be at most 3 Ω/□. When an electrical resistance value of the transparent electrode exceeds 50 Ω/□, photoelectric conversion efficiency may be inferior in an organic photoelectric conversion element having a large sized photo reception area. It is possible to determine the above surface resistivity, for example, based on MS K7194: 1994 (Test method for resistivity of conductive plastics with a 4-pin probe measurement method). Further, it is also possible to conveniently determine the surface resistivity employing a commercially available surface resistivity meter.

The thickness of the transparent electrode unit 4 of the present invention is not particularly limited, and it is possible to appropriately select the thickness depending on the intended purposes. However, commonly the thickness is preferably at most 10 µm. The thickness is more preferably thinner since transparency and flexibility are thereby improved in proportion to the reduction of the thickness. The thickness of the transparent electro conductive layer A composed of the metal nanowire 1 and the transparent electro conductive material 2 is preferably from 100 nm to 10 µm, and more preferably, it is from 1.0 µm to 5.0 µm. The thickness of the first transparent resin 3 is preferably from 30 nm to 1.0 µm, and more preferably, it is from 100 nm to 5700 nm.

An organic photoelectric conversion element of the present invention is characterized in that the first electrode unit 4 contains an electro conductive fiber. As an electro conductive fiber used for the present invention, it can be used the followings: an organic or inorganic fiber which is coated with a metal, a conductive metal oxide fiber, a metal nanowire, a carbon fiber and a carbon nanotube. Among them, a metal nanowire is preferably used.

Generally, metal nanowires indicate a linear structure composed of a metallic element as a main structural element. In particular, the metal nanowires in the present invention indicate a linear structure having a diameter of a nanometer (nm) size.

In order to form a long conductive path by one metal nanowire, a metal nanowire according to the present invention is preferably have an average length of 3 µm or more, more preferably it is 3-500 µm, and still more preferably it is 3-300 µm. In addition, the relative standard deviation of the length of the conductive fibers is preferably 40% or less. Moreover, from a viewpoint of transparency, a smaller average diameter is preferable, on the other hand, a larger average diameter is preferable from an electro conductive viewpoint. In the present invention, 10-300 nm is preferable as an average diameter of metal nanowires, and it is more preferable to be 30-200 nm. Further, the relative standard deviation of the diameter is preferably to be 20% or less.

There is no restriction in particular to the metal composition of the metal nanowire of the present invention, and it can be composed of one sort or two or more metals of noble metal elements or base metal elements. It is preferable that it contains at least one sort of metal selected from the group consisting of noble metals (for example, gold, platinum, silver, palladium, rhodium, iridium, ruthenium and osmium), iron, cobalt, copper and tin. It is more preferable that silver is included in it at least from an electro conductive viewpoint. Moreover, for the purpose of achieving compatibility of electro conductivity and stability (sulfuration resistance and oxidation resistance of metal nanowire and migration resistance of metal nanowire), it is also preferable that it contains silver and at least one sort of metal belonging to the noble metal except silver. When the metal nanowire of the present invention contains two or more kinds of metallic elements, metal composition may be different between the surface and the inside of metal nanowire, and the whole metal nanowire may have the same metal composition.

In the present invention, there is no restriction in particular to the production means of metal nanowires. It is possible to prepare metal nanowires via various methods such as a liquid phase method or a gas phase method. For example, the manufacturing method of Ag nanowires may be referred to Adv. Mater. 2002, 14, 833-837 and Chem. Mater. 2002, 14, 4736-4745; a manufacturing method of Au nanowires may be referred to JP-A No. 2006-233252; the manufacturing method of Cu nanowires may be referred to JP-A No. 2002-266007; while the manufacturing method of Co nanowires may be referred to JP-A No. 2004-149871. Specifically, the manufacturing methods of Ag nanowires described in Adv. Mater. 2002, 14, 833-837 and Chem. Mater. 2002, 14, 4736-4745 may be preferably employed as a manufacturing method of the metal nanowires according to the present invention, since via those methods, it is possible to simply prepare a large amount of Ag nanowires in an aqueous system and the electrical conductivity of silver is highest of all metals.

In the present invention, a three-dimensional conductive network is formed by mutual contact of nanowires and high electro conductivity is achieved. By this, a light can penetrate the window part of the conductive network where metal nanowires do not exist, and further, it becomes possible to perform efficiently the generation of electricity by the light scattering effect of the metal nanowires in the organic power generation layer unit. By locating the metal nanowire in the first electrode unit at the portion near the organic power generation layer unit, this light scattering effect can be more effectively used, therefore, this is a more preferable embodiment

[Composition Elements in the First Electrode Other than the Metal Nanowire]

In the present invention, by allowing to contain the electro conductive fiber, specifically the metal nanowire in the first electrode unit, a scattering effect of the light by the metal nanowires is acquired. In addition, since a metal nanowire has a high electro conductivity, it is possible to use together other materials such as a resin having a low refractive index, without degrading electro conductivity. It becomes possible to make the refractive index of the first electrode unit to be lower than that of the power generation layer unit. As a result, it is possible to restrain the reflection at each of the interfaces of the substrate, the first electrode unit, and the power generation layer unit, and the light can be made to effectively reach the power generation layer unit by this. In order to produce this effect effectively, it is desirable that the average refractive index of the first electrode unit is lower than the average refractive index of the organic power generation layer unit.

Although the first electrode of the present invention contains electro conductive fibers, especially, metal nanowires, in order to hold the metal nanowires, it is preferable to use together a certain transparent resin, or a transparent inorganic material. What is necessary is just to choose a material suitably so that the above-mentioned requirement for refractive index may be satisfied. Such material is not specifically limited. Examples of the material include: a polyester resin, a polystyrene resin, an acrylic resin, a polyurethane resin, an acrylic urethane resin, a polycarbonate resin, a cellulose resin and a butyral resin. These can be used solely, or can be used in combination of two or more. Moreover, it may be a UV curable resin.

As described above, one of the preferred embodiments of the present invention has the following structure. When the two or more layers containing a metal nanowire and constituting the first electrode unit is divided in one half of the coating thickness position, it is preferable that the average haze values EH1 and EH2 satisfy the relationship of EH1<EH2, provide that the average haze value in the portion of the one half of the coating thickness near the transparent substrate is EH1, and the average haze value in the portion of the one half of the coating thickness near the organic power generation layer unit is EH2. By making this structure, the optical length is more effectively lengthened by scattering of the incident light, thereby the scattering effect of the metal nanowire of the present invention can be exhibited to the maximum extent The haze value of the first electrode unit can be changed by the content and the diameter of the metal nanowire, or the content and the particle size of the conductive metal oxide which will be described later.

One of the preferred embodiments of the organic photoelectric conversion element of present invention has the following structure, in which the first electrode comprises a metal nanowire as an electro conductive fiber, a first transparent resin component and a second transparent resin component which has a higher refractive index than the first transparent resin component; the first transparent resin component is contained with a higher content in a region near the transparent substrate; and the second transparent resin component and the metal nanowire are contained with a higher content in a region near the organic power generation layer unit.

In this structure, it is more preferable that the second transparent resin component is a transparent conductive polymer.

Another one of the preferred embodiments of the organic photoelectric conversion element of present invention has the following structure, in which the first electrode comprises a metal nanowire as an electro conductive fiber, a first transparent resin component and a transparent inorganic component which has a higher refractive index than the first transparent resin component; the first transparent resin component is contained with a higher content in a region near the transparent substrate; and the transparent inorganic component and the metal nanowire are contained with a higher content in a region near the organic power generation layer unit. In this structure, it is more preferable that the transparent inorganic component is a transparent conductive metal oxide.

As described above, the preferred embodiment of the present invention is one to incorporate a conductive polymer as a second transparent resin component and a transparent metal oxide as a transparent inorganic component. By using a conductive polymer and a transparent metal oxide, it is possible to pass electric current in the minute region of the window portion which does not exist a metal nanowire, thereby it is possible to function as an almost perfectly flat electrode. In order to function as an almost perfect flat electrode, it is required that the conducting material itself has a surface resistance of $10^{10}\Omega/\square$ or less, and more preferably it is $10^{8}\Omega/\square$ or less.

Examples of the conductive polymer as described above can be cited compounds selected from the group of derivatives of polypyrrole, polyaniline, polythiophene, poly thienylene vinylene, polyazulene, polyisothianaphthene, polycarbazole, polyacetylene, polyphenylene, polyphenylene vinylene, polyacene, polyphenyl acetylene, polydiacetylene, and polynaphthalene.

As a transparent conductive metal oxide, there can be cited a metal oxide particle, a composite metal oxide particle, a composite metal oxide particle doped, or a metal oxide sol thereof, such as: $ZrO_2$, $CeO_2$, $ZnO$, $TiO_2$, $SnO_2$, $Al_2O_3$, $In_2O_3$, $SiO_2$, $MgO$, $BaO$, $MoO_2$, and $V_2O_5$. Among them, the following are preferably used from a viewpoint of conductivity or transparency, a particle or a sol indium oxide doped with tin or zinc (ITO and IZO); zinc oxide doped with aluminium or gallium (AZO and GZO); and tin oxide doped with fluorine, or antimony (FTO and ATO). Although these may be used solely, they may be used together with other resin components.

Moreover, in the present invention, it is preferable that particles coexist in the region where the first transparent resin component exists.

In the present invention, by making the particles exist with the first transparent resin component, it becomes possible to raise the optical incorporation at the interface between the first electrode unit and the transparent substrate, and this is one of more preferable embodiments of the present invention.

An average particle diameter applicable to the present invention is preferably from 0.05 to 5 μm, more preferably it is from 0.05 to 2 μm. When it is less than 0.05 μm, the effect of scattering or refracting light is small. And when it is larger than 5 μm, the surface smoothness will become a problem. The refractive index of the particles is preferably from 1.7 to 3.0, and it is more preferably from 1.75 to 2.3. Within this range, the component which scatters the light in the back direction will be large, and the light confining efficiency can be improved with suppressing decrease in transmittance. An average particle diameter of the particles described in the present invention can be obtained by an particle size measurement instrument, for example, using an electrophoresis light-scattering photometer"ELS-800" (made by an OTSUKA ELECTRONICS CO., LTD. company), and using commercially available measurement instruments using a light scattering method, an electrophoresis method, and a laser Doppler method, for example. Moreover, it is possible to obtain an average particle diameter of the particles by performing image shooting with a transmission electron micrograph (TEM) to take pictures of at least 100 or more particles, and by performing a statistical procedure using image-analysis software, such as Image-Pro (made by Media Cybernetics Company). The value measured with the above-mentioned TEM was used for the average particle diameter of the particles used in the present invention.

The refractive index of the particles is preferably from 1.1 to 2.0, and it is more preferably from 1.3 to 1.7. Within this range, the component which scatters the light in the back direction will be small, and the light confining efficiency can be improved with suppressing decrease in transmittance. As such particles, there can be cited: cross linked acrylic particles, cross linked styrene particles, silica particles, melamine/formaldehyde condensate particles, complex particles of these materials. These particles may be used independently and it may be used together with two or more sorts.
(Production Method of the First Electrode Unit)

Although there is no restriction in particular for the production method of the first electrode unit, if all of the additives are prepared in a coating solution system, it becomes possible to use so called a roll-to roll production method. It is possible to produce continuously at high speed with simpler equipment compared with a vacuum process, and it is more preferable.

In the method for producing the organic photoelectric conversion element of the present invention, when a transparent electro conductive layer composed of a single layer on a transparent substrate is formed, the method is characterized as follows:

at first the transparent electro conductive layer containing the electro conductive fiber and the transparent electro conductive material is formed on a mold-releasing substrate; then the first electrode unit is formed by transferring the formed transparent electro conductive layer on the transparent substrate.

On the other hand, in the method for producing the organic photoelectric conversion element of the present invention, when a transparent electro conductive layer composed of two or more layers on a transparent substrate is formed, the method is characterized as follows.

at first a layer A containing the first transparent resin component is formed on the transparent substrate; then a layer B containing the electro conductive fiber and the second transparent resin component which have been formed on a mold-releasing substrate, or a layer C containing the electro conductive fiber and the transparent inorganic component which have been formed on a mold-releasing substrate is transferred on the layer A containing the first transparent resin component so as to form the first electrode unit.

That is, there is used a method for forming a transparent electrode, in which after forming on a mold-releasing surface of a smooth mold-releasing substrate a layer containing: a conductive fiber, preferably a metal nanowire; and the second transparent resin component or a transparent inorganic component, then these layers are transferred on a transparent substrate to form a transparent electrode.

Although the surface smoothness of the first electrode unit is required for an organic photoelectric conversion element, it can be accomplish high-smoothness easily and stably by using this way. Furthermore, it becomes possible to provide the layer which contains the metal nanowire, and the second transparent resin component or the transparent inorganic component each having relatively high refractive index in the side near an organic power generation layer part by this way.

As a mold-releasing substrate used in the production method of the transparent electrode using this transfer process, the resin substrate and the resin film, etc. are cited suitably. There is no restriction in particular in this resin, and it can be chosen suitably from the known resins. The substrate and the film which are composed of a single layer or a plurality of layers made of a synthetic resin are used suitably. Examples of the resins include: a polyethylene terephthalate resin, a vinyl chloride resin, an acrylic resin, a polycarbonate resin, a polyimide resin, a polyethylene resin, and a polypropylene resin. Furthermore, a glass substrate and a metallic base can also be used. Moreover, it may be performed a surface treatment to the surface (mold-release surface) of the mold-releasing substrate lubricants by coating a releasing agent such as a silicone resin, a fluororesin, or a wax, if needed.

Since the surface of the mold-releasing substrate affects the surface smoothness of the surface after transferring a transparent electro conductive layer, it is desirable that it has high smoothness. Specifically, it is desirable that the surface of the mold-releasing substrate satisfies the condition of: $Ry \leq 50$ nm, more desirably, $Ry \leq 40$ nm, and still more desirably, $Ry \leq 30$ nm. Moreover, it is desirable that $Ra \leq 5$ nm, more desirably $Ra \leq 3$ nm, and still more desirably $Ra \leq 1$ nm.

In the present invention, Ry and Ra which show the surface smoothness of the surface of the transparent electro conductive layer are a value having the following meaning. Ry is a maximum height (a vertical interval between a summit part and a bottom part of the surface), and Ra is an arithmetic mean roughness. They are values based on the description specified in JIS B601 (1994).

It is preferable that the first electrode unit having a transparent electro conductive layer of the present invention has a surface smoothness of the surface of the transparent electro conductive layer of $Ry \leq 50$ nm. Moreover, as for the surface smoothness of the surface of the transparent electro conductive layer, it is desirable that $Ra \leq 5$ nm. In the present invention, a commercially available atomic force microscope (Atomic Force Microscopy: AFM) can be used for measurement of Ry and Ra, for example, they can be measured by the following ways.

In order to evaluate the smoothness, an atomic force microscope (AFM) SPI3800N probe station and SPA400 multi-functional-capability type module made by Seiko Instruments Co., Ltd. are used. The specimen cut off in the magnitude of an about 1 cm square is set on the horizontal sample stand on a piezo scanner. A cantilever is approached to the surface of the specimen, and the cantilever is scanned in the XY direction at the place where atomic force works, and the irregularity of the specimen is caught by displacement of piezo in a Z direction. The used piezo scanner can scan the XY direction of 150 μm and the z direction of 5 μm. The employed cantilever is a silicon cantilever SI-DF20 (made by Seiko Instruments Co., Ltd.), and measurement was done in a DFM mode (Dynamic Force Mode) using the resonant frequency of 120-150 kHz, and the spring constant of 12-20 N/m. The portion of 80×10 μm was measured with the scanning frequency of 0.1 Hz.

There is no restriction in particular in the way of forming the transparent electro conductive layer which contains the second transparent resin component or the transparent inorganic component along with the metal nanowire on the mold-releasing surface of a mold-releasing substrate. However, it is preferable to use liquid phase film forming methods, such as a coating method and a printing method, from the viewpoints of improvement in manufacturing efficiency, improvement in electrode quality such as surface smoothness and homogeneity, and reduction of environmental impact. As a coating method, there can be employed the method of a roller coating method, a bar coating method, a dip coating method, a spin coating method, a casting method, a die coating method, a blade coating method, a gravure coating method, a curtain coating method, a spray coating method, and a doctor coating method, a letterpress (typographic) printing method, a porous (screen) printing method, a lithographic (offset) printing method, an intaglio (gravure) printing, a spray printing method and an ink-jet printing method. In addition, a physical surface treatment, such as corona discharge treatment and a plasma discharge process, can be performed to a mold-releasing substrate as a primary treatment for raising adhesion and coating property if needed.

As a bonding agent at the time of transferring on a transparent substrate, the first transparent resin component concerning the present invention should just exhibit this function. For example, what is necessary is just to use above-mentioned transparent resin, and a bonding agent may be formed in the mold-releasing substrate side, and it may be formed in the transparent substrate side. As a bonding agent, it will not be limited especially as long as it is a material transparent in a visible region and it has transfer ability. As long as it is transparent, it may be a curable resin may or it may be a thermoplastic resin. As a curable resin, there can be cited, for example, a heat curing resin, an ultraviolet curing resin, and an electron beam curing resin. Among these curable resins, since the instrument for resin curing is simple, and it excels in working property, it is desirable to use an ultraviolet curing resin. An ultraviolet curing resin is a resin hardened through a cross linkage reaction by UV irradiation, and the ingredient containing the monomer having an ethylenically unsaturated double bond is used preferably. For example, there can be cite: an acrylic urethane resin, a polyester-acrylates resin, an epoxy acrylate resin, a polyol acrylate resin. In the present invention, it is desirable to use an ultraviolet curing resin of an acrylic system and an acrylic urethane system as a main ingredient as a binder.

An acrylic urethane resin can be easily obtained by further reacting an acrylic monomer which has a hydroxyl group with a product obtained by having reacted the isocyanate monomer or a prepolymer with a polyester polyol. Examples of an acrylic monomer which has a hydroxyl group include: 2-hydroxyethyl acrylate, 2-hydroxyethyl methacrylate (hereafter, only acrylate is indicated as including methacrylate), and 2-hydroxypropyl acrylate. For example, the compounds described in JP-A No. 59-151110 can be used. A mixture of UNIDIC 17-806 (made by DIC Corporation) 100 parts and CORONATE L (made by Nippon Polyurethane Ind. Co., Ltd.) 1 part is used preferably.

As an ultraviolet curing polyester-acrylate resin, it can be cited a compound formed easily by reacting a monomer of 2-hydroxyethyl acrylate or 2-hydroxy acrylate with polyester polyol. The compounds described in JP-A No. 59-151112 can be used.

As a specific example of an ultraviolet curing epoxy acrylate resin, it can be cited a compound obtained from an oligomer of an epoxy acrylate resin by adding a reactive diluent and a photoinitiator in the oligomer. The compounds described in JP-A No. 1-105738 can be used.

As a specific example of an ultraviolet curing polyol acrylate resin, it can be cited: trimethylolpropane triacrylate, ditrimethylolpropane tetraacrylate, pentaerythritol triacrylate, pentaerythritol tetraacrylate, dipentaerythritol hexaacrylate, and alkyl modified dipentaerythritol pentaacrylate.

The following generally used monomers can be cited as a resin monomer. For example, examples of a monomer having one unsaturated double bond include: methyl acrylate, ethyl acrylate, butyl acrylate, benzyl acrylate, cyclohexyl acrylate, vinyl acetate, and styrene. Examples of a monomer having tow or more unsaturated double bonds include: ethylene glycol diacrylate, propylene glycol diacrylate, divinylbenzne, 1,4-cyclohexane diacrylate, 1,4-cyclohexyl dimethyldiacrylate, above-mentioned trimethylolpropane triacrylate, and pentaerythritol tetraacrylic ester.

Among these, an actinic ray curing resin of acrylic system chosen from the following compounds is desirable as a main ingredient of a binder: 1,4-cyclohexane diacrylate, pentaerythritol tetra(meth)acrylate, pentaerythritol tri(meth)acrylate, trimethylolpropane (meth)acrylate, trimethylolethane (meth)acrylate, dipentaerythritol tetra(meth)acrylate, dipentaerythritol penta(meth)acrylate, dipentaerythritol hexa(meth)acrylate, a 1,2,3-cyclohexane tetramethacrylate, polyurethane polyacrylate, and polyester polyacrylate.

As a photoinitiator of these ultraviolet curing resin, there can be cited the following compounds and their derivatives such as: benzoin and its derivative, acetophenone, benzophenone, hydroxybenzophenone, Michler's ketone, α-amyloxim ester, and thioxanthone. These may be used with a photosensitizer. The above-mentioned photoinitiators can also be used as a photosensitizer. Moreover, sensitizers, such as n-butylamine, triethylamine, and tri-n-butylphosphine, can be used when an epoxy acrylate photoinitiator is used. The amount of the photoinitiator and the photosensitizer which are used for an ultraviolet curing resin composition are 0.1-15 mass parts to 100 mass parts of the ultraviolet curing resin composition, and preferably it is 1-10 mass parts.

After pasting together the mold-releasing substrate on which was formed the transparent electro conductive layer with the transparent substrate, UV light was irradiated to harden a bonding agent, and then by exfoliating the mold-releasing substrate, the transparent electro conductive layer can be transferred to the transparent base side. Here, the way of bonding is not specifically limited. Although a seat press and a roll press can be performed, it is desirable to cany out bonding using a roll press machine. A roll press is a way in which a film to be adhered is held between the rolls by pressure, and rotating a roll is carried out. When a roll press is used, a pressure can be applied uniformly and manufacturing efficiency is better than that of a seat press.

(Patterning Method)

The first electrode unit concerning the present invention may be patterned. There is no restriction in particular to the method and process of patterning, and a well-known approach can be applied suitably. For example, after forming the transparent electro conductive layer containing a metal nanowire, a conductive polymer, and a transparent conductive metal oxide which were patterned on the mold-releasing surface, then by transferring the aforesaid layer onto a transparent substrate, the patterned transparent electrode can be obtained. Specifically, the following methods can be preferably used.

(i) The method in which a transparent electro conductive layer containing a metal nanowire and a second transparent resin component, or a transparent inorganic component directly built in a pattern by using a printing method on a mold-releasing substrate.

(ii) The method in which a transparent electro conductive layer containing a metal nanowire and a second transparent resin component, or a transparent inorganic component is uniformly built on a mold-releasing substrate, then pattering is carried out using the general photolithographic process.

(iii) The method in which a transparent electro conductive layer containing a metal nanowire incorporating a UV curable resin and a second transparent resin component, or a transparent inorganic component is uniformly built, then pattering is carried out using a photolithographic process.

(iv) The method in which a transparent electro conductive layer containing a metal nanowire and a second transparent resin component, or a transparent inorganic component is built in a negative pattern which has been formed beforehand on a mold-releasing substrate, then patterning is carried out using a lift off method.

By using any one of the above-mentioned methods, the patterned transparent electrode can be formed by transferring the transparent electro conductive layer containing a metal nanowire and a second transparent resin component, or a transparent inorganic component produced in a pattern on the mold-releasing substrate onto a transparent substrate.

(Second Electrode: Counter Electrode)

The second electrode concerning the present invention becomes a cathode in an organic photoelectric conversion element. The second electrode concerning the present invention may be a single layer made of a conducting material. In addition to the material which has conductivity, it may be used a resin which holds such material together. As a conducting material used for the second electrode, it can be used: a metal, an alloy, an electric conductive compound, and a mixture thereof which has a small work function (less than 4 eV). Specific examples of such electrode material include: sodium, a sodium potassium alloy, magnesium, lithium, a magnesium/copper mixture, a magnesium/silver mixture, a magnesium/aluminum mixture, a magnesium/indium mixture, an aluminum/aluminium oxide ($Al_2O_3$) mixture, indium, a lithium/aluminium mixture and a rare earth metal. Among these, from the viewpoint of an electron injection property and resistivity to oxidation, a mixture of these metals and the second metal having a larger work function than these metals is suitable. Examples of these are: a magnesium/silver mixture, a magnesium/aluminum mixture, a magnesium/indium mixture, an aluminum/aluminium oxide ($Al_2O_3$) mixture, a lithium/aluminum mixture and aluminium. A cathode can be produced by using these electrode materials with a method such as a vacuum evaporation method or a sputtering method. In addition, below hundreds of $\Omega/\square$ of the sheet resistance of the cathode is preferably below hundreds of $\Omega/\square$. Moreover, the coating thickness thereof is usually chosen from the range of 10 nm to 5 μm, and preferably it is chosen from the range of 50 to 200 nm.

When a metallic material is used as a conductive material for the second electrode unit side, the light which reaches the second electrode unit will be reflected and returns to the first electrode unit side. Although the metal nanowire of the first electrode unit scatters or reflects backward a part of the light, by using a metallic material as an electro conductive material for the second electrode unit, reuse of this light is achieved and the photoelectric conversion efficiency can be further improved.

(Solar Cell)

Figure 3:
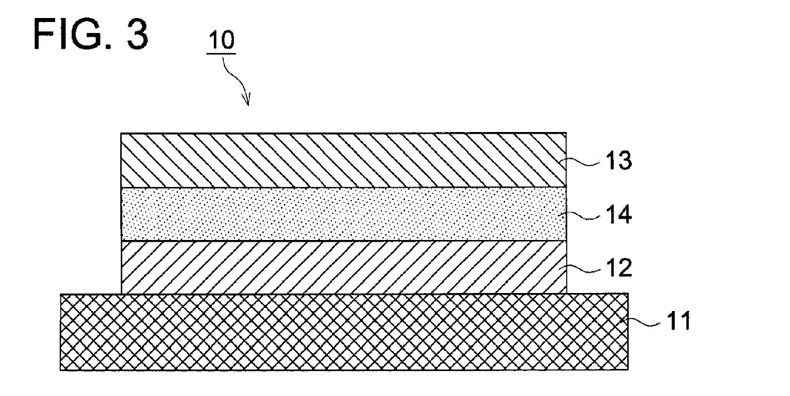
FIG. 3 is a cross-sectional view showing an example of a solar cell having an organic photoelectric conversion element with bulk heterojunction.

FIG. 3 is a cross-sectional view showing an example of a solar cell having an organic photoelectric conversion element of a bulk heterojunction type.

In FIG. 3, an organic photoelectric conversion element 10 of a bulk heterojunction type has a successively laminated structure on one surface of a substrate 11: a transparent electrode 12, a photoelectric conversion unit 14 of a bulk heterojunction layer, and a counter electrode 13.

The transparent substrate 11 is a member holding successively laminated members of: the transparent electrode 12, the photoelectric conversion unit 14 and the counter electrode 13. In this embodiment, since the incident light by which photoelectric conversion is carried out enters from the transparent substrate 11 side, the transparent substrate 11 is a member which enables to pass through this light by which photoelectric conversion is carried out, i.e., it is a transparent member to the wave length of this light that should be carried out photoelectric conversion. As for the transparent substrate 11, a glass substrate and a resin substrate are used, for example.

The first electrode unit concerning the present invention is used for the transparent electrode 12.

As a material for the counter electrode 13, although it can be used a metal (for example, gold, silver, copper, platinum, rhodium, ruthenium, aluminium, magnesium and indium), carbon, and a material for the transparent electrode 12, the material is not limited to these.

In the organic photoelectric conversion element 10 of a bulk heterojunction type shown in FIG. 3, although the photoelectric conversion unit 14 is sandwiched by the transparent electrode 12 and the counter electrode 13, it is possible to make a photoelectric conversion element 10 having a composition of a back contact type in which a pair of comb dentate electrodes is formed on one side of the photoelectric conversion unit 14.

The photoelectric conversion layer 14 is a layer which converts light energy into electric energy, and it is composed of a bulk heterojunction layer uniformly mixed with a p-type semiconductor material and an n-type semiconductor material. A p-type semiconductor material functions relatively as an electron donor (donor), and an n-type semiconductor material functions relatively as an electron acceptor (acceptor). Here, an electron donor and an electron acceptor are "an electron donor and an electron acceptor which form a pair of electron and positive hole (charge separation state) by transfer of an electron from an electron donor to an electron acceptor when a light is absorbed." That is, an electron is not donated or received like an electrode, but an electron is donated or received by a photoreaction.

As a p-type semiconductor material used for the present invention, various types of condensed polycyclic aromatic compounds and conjugated system compounds are cited.

Examples of a condensed polycyclic aromatic compound include: anthracene, tetracene, pentacene, hexacene, heptacene, chrysene, picene, fulminene, pyrene, peropyrene, perylene, terylene, quoterylene, coronene, ovalene, circumanthracene, bisanthene, zethrene, heptazethrene, pyanthrene, violanthene, isoviolanthene, circobiphenyl, anthradithiophene and a derivative or a precursor thereof.

Examples of a conjugated system compound include: polythiophene and its oligomer, polypyrrole and its oligomer, poly aniline, polyphenylene and its oligomer, polyphenylene vinylene and its oligomer, poly thienylene vinylene and its oligomer, polyacetylene, polydiacetylene, a tetrathiafulvalene compound, a quinone compound, a cyano compound such as a tetracyanoquinodimethane, fullerene, a derivative thereof and a mixture thereof.

Among polythiophene and its oligomer, suitably used oligomers are thiophene hexamers such as: α-sexithiophene, α,ω-dihexyl-α-sexithiophene, α,ω-dihexyl-α-quinquethiophene, and α,ω-bis(3-butoxypropyl)-α-sexithiophene.

Further, there can be used the following compounds: porphyrin, copper phthalocyanine; organic molecule complex such as tetrathiafulvalene crIF)-tetracyanoquinodimethane (TCNQ) complex, bisethylenetetrathiafulvalene (BED ITIF)-perchloric acid complex, BEDTTTF-Iodine complex, TCNQ-Iodine complex; fullerenes such as fullerene $C_{60}$, fullerene $C_{70}$, fullerene $C_{76}$, fullerene $C_{78}$, and fullerene $C_{84}$; carbon nanotube such as SWNT; dyes such as merocyanine dye and hemicyanine dye; σ conjugated polymers such as polysilane and polygerman, and organic-inorganic mixed materials disclosed in JP-A No. 2000-260999.

Among these π conjugated materials, preferable is a compound selected from the group consisting of condensed polycyclic aromatic compounds such as pentacene, fullerene compounds, condensed cyclic tetracaroboxylic acid diimide compounds, metal phthalocyanine compounds and metal porphiline compounds. Here, pentacene is more preferable Examples of a pentacene compound are: pentacene compounds having a substituent disclosed in WO 03/16599, WO 03/28125, U.S. Pat. No. 6,690,029, and JP-A No. 2004-107216; pentacene precursors disclosed in US 2003/136964; substituted acenes and their derivatives disclosed in J. Amer. Chem. Soc., vol. 127. No. 14, 4986.

Among these compounds, preferable is a compound having a sufficiently high solubility to an organic solvent to be able to carry out a solution process, after dying, capable of forming a crystalline thin film and capable of achieving high mobility. Examples of such compounds are: acene compounds substituted with a trialkylsilylethynyl described in J. Amer. Chem. Soc., vol. 123, p9482 and J. Amer. Chem. Soc., vol. 130 (2008), No. 9, 2706; pentacene precursors disclosed in US 2003/136964; precursor type compounds (precursors) such as porphiline precursors disclosed in JP-A No. 2007-224019. Among these, the latter precursor type compounds can be preferably used. Precursor type compound becomes insoluble after being converted. As a result, when there are formed a positive hole transport layer, an electron transport layer, a positive hole block layer and an electron block layer, etc on a bulk heterojunction layer in a solution process, it will prevent dissolution of a bulk heterojunction layer. As a result, the materials which constitute the forgoing layers will not be mixed with the material which constitutes bulk heterojunction layer, and further improved efficiency and increased lifetime can be attained.

Examples of an n-type semiconductor material used for the present invention, the followings can be cited: fullerene $C_{60}$, fullerene $C_{70}$, fullerene $C_{76}$, fullerene $C_{78}$, fullerene $C_{84}$, fullerene $C_{240}$, fullerene $C_{540}$, mixed fullerene, fullerene nano-tube, multi layer nano-tube, mono layer nano-tube, and nano-horn (cone type), octaazaporphyrin, a perfluoro compound of a p-type semiconductor (perfluoropentacene and perfluorophthalocyanine), naphthalenetetracarboxylic anhydride, naphthalenetetracarboxylic diimide, perylenetetracarboxylic anhydride, and perylenetetracarboxylic diimide, an aromatic carboxylic acid anhydride and its imide in the structure such as perylenetetracarboxylic anhydride or its imide compound or a polymer compound which contains these structure as a backbone.

As a method for forming a bulk heterojunction layer made by mixing an electron acceptor and an electron donor, a vacuum deposition method and a coating method (including a cast method and a spin coat method) can be cited. Among these, a coating method is specifically preferable.

The bulk heterojunction layer in the photoelectric conversion unit 14 is subjected to an annealing treatment at a prescribed temperature during the manufacturing process in order to improve photoelectric conversion efficiency, and a portion of the layer is crystallized microscopically.

In FIG. 3, the incident light entering the transparent electrode 12 through the transparent substrate 11 is absorbed by an electron donor or an electron acceptor in the bulk heterojunction layer of the photoelectric conversion unit 14. An electron is transferred from the electron donor to the electron acceptor to form a pair of electron and positive hole (charge separation state). The generated electric charge is transported by an internal electric field, for example, the electric potential difference of the transparent electrode 12 and the counter electrode 13 when the work function of the transparent electrode 12 and the counter electrode 13 are different. An electron passes through electron acceptors, while a positive hole passes through electron donors, and the electron and the positive hole each are respectively transported to a different electrode, and a photocurrent is detected. For example, when the work function of the transparent electrode 12 is larger than the work function of the counter electrode 13, the electron is transported to the transparent electrode 12 and the positive hole is transported to the counter electrode 13. In addition, if the size of a work function is reversed, the electron and the positive hole will be transported to the reverse direction to that described above. Moreover, the transportation direction of an electron and a positive hole is also controllable by applying a potential between the transparent electrode 12 and the counter electrode 13.

Although the photoelectric conversion unit 14 may be composed of a single layer uniformly mixed with an electron acceptor and an electron donor, it may be composed of a plurality of layers each having a different mixing ratio of an electron acceptor and an electron donor.

As a method for forming a bulk heterojunction layer made by mixing an electron acceptor and an electron donor, a vacuum deposition method and a coating method (including a cast method and a spin coat method) can be cited. Among these, a coating method is specifically preferable in order to produce an element having an increased interface at which the positive hole and the electron are in the charge separated state, and having high photoelectron conversion efficiency. After the coating is performed, it is preferable to heat the coated material in order to remove the residual solvent, water, gas, and to trigger the chemical reaction of the above semiconductor materials.

The above-described organic photoelectron conversion element 10 of heterojunction type is composed on the transparent substrate by successively laminating the transparent electrode 12, the photoelectric conversion unit 14 having a bulk heterojunction layer, and the counter electrode 13 in this order. However, the present invention is not limited to this. It may be formed an organic photoelectron conversion element 10 of bulk heterojunction type having other layers, such as a positive hole transport layer, an electron transport layer, a positive hole block layer, an electron block layer, or a smoothing layer between the transparent electrode 12, the counter electrode 13, and the photoelectric conversion unit 14. Among these, by forming a positive hole transport layer or an electron block layer between the bulk heterojunction layer and the anode (usually, the transparent electrode 12 side), and an electron transport layer or a positive hole block layer between the bulk heterojunction layer and the cathode (usually, the counter electrode 13 side), it is possible to take out effectively the electric charge which is generated in the bulk heterojunction layer. Therefore, it is preferable to have these layers.

As materials to form these layers, it can be used the following. For example, for a positive hole transport layer (an electron block layer), it can be used PEDOT (Baytron™ P, made by Starck-V Tech Co., Ltd.), polyaniline and their dope materials, a triarylamine disclosed in JP-A No. 5-271166, a cyan compound disclosed in WO 2006/019270, and metal oxides such as molybdenum oxide, nickel oxide and tungsten oxide. It is also possible to use a layer consisted of a p-type semiconductor single material used for a bulk heterojunction layer. As a method to form these layers, although it may be used any one of a vacuum deposition method and a solution coating method, a solution coating method is preferably used.

Moreover, for an electron transport layer (an positive hole block layer), it can be used: an octaaza porphyrin, a perfluoro compound of a p-type semiconductor (perfluoro pentacene and perfluoro phthalocyanine), naphthalene tetracarboxylic anhydride, naphthalene tetracarboxylic diimide, perylene tetracarboxylic anhydride, an n-type semiconductor material such as perylene tetracarboxylic diimide, an n-type inorganic oxide such as titanium oxide, zinc oxide and gallium oxide. It may be used a layer consisted of an n-type semiconductor single material used for a bulk heterojunction layer. As a method to form these layers, although it may be used any one of a vacuum deposition method and a coating method, a solution coating method is preferably used.

Figure 4:
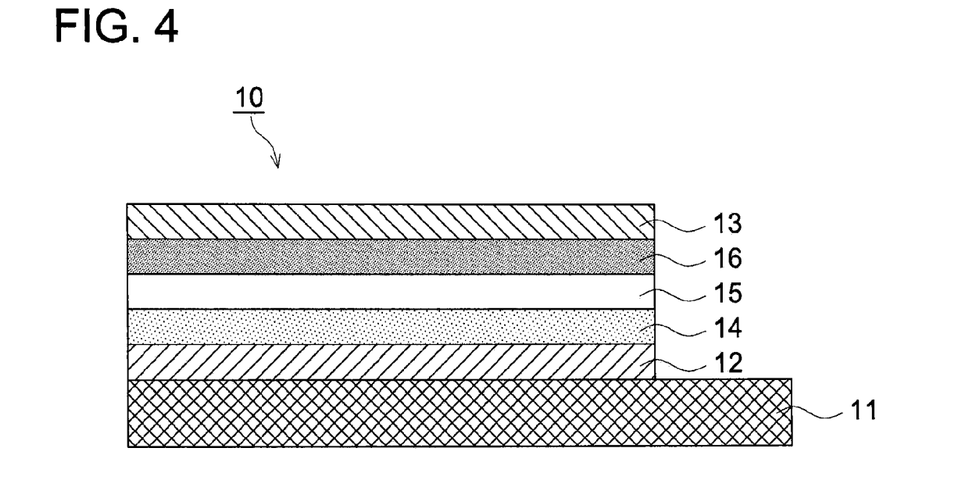
FIG. 4 is a cross-sectional view showing a solar cell having an organic photoelectric conversion element provided with tandem type bulk heterojunction layers.

Furthermore, it is also possible to make a tandem type structure produced by laminating a plurality of the aforesaid photoelectric conversion elements for the purpose of improving a sunlight utilization factor (photoelectric conversion efficiency). FIG. 4 is a cross-sectional view showing a solar cell having an organic photoelectric conversion element of bulk heterojunction type containing bulk heterojunction layers of a tandem type. A tandem type structure can be made as follows. After successively laminating the transparent electrode 12 and the first photoelectric conversion layer 14 on the transparent substrate 11 in this order, a charge recombination layer 15 is laminated. Then, a second photoelectric conversion layer 16 and the counter electrode 13 are laminated to achieve a tandem type structure. The second photoelectric conversion layer 16 may be a layer which absorbs the same spectrum as an absorption spectrum of the first photoelectric conversion layer 14, or it may be a layer which absorbs a different spectrum. Preferably, the second photoelectric conversion layer 16 absorbs a different spectrum from that of the first photoelectric conversion layer 14. As a material for the charge recombination layer 15, it is preferable that it is a layer incorporating a compound having both transparency and electro conductivity. Preferable materials are: transparent metal oxides such as ITO, AZO, FTO, and a titanium oxide; very thin metal layers such as Ag, aluminum, and Au; and conductive polymers such as PEDOT: PSS, and poly aniline.

Further, it is preferable that the produced organic photoelectron conversion element 10 is sealed with known method in order to prevent deterioration by oxygen and water existing in an ambient. For example, the following methods can be cited: method of carrying out sealing by pasting up the cap made of aluminium or glass with an adhesive agent; a method of adhering a plastic film in which a gas barrier layer made of aluminium, silicon oxide, or aluminium oxide has been formed, with an organic photoelectric conversion element with an adhesive agent; a method of spin coating a polymer material having a high gas barrier property (for example, polyvinyl alcohol); a method of depositing under a vacuum condition an inorganic thin film (for example, silicon oxide and aluminium oxide), or an organic layer (foe example, parylene) which has a high barrier property; and a method of laminating these layers by combining these methods.

EXAMPLES

The present invention will be described below with reference to examples, but the present invention is not limited to these. In examples, "part" or "%" will be used. Unless particularly mentioned, these represents "mass part" or "mass %".

Example 1

<Preparation of Organic Photoelectric Conversion Element>
[Preparation of Organic Photoelectric Conversion Element STC-1]
(Preparation of Metal Nanowire)

In the present example, a silver nanowire was used as a metal wire. The silver nanowire was prepared with reference to the method described in Adv. Mater., 2002, 14, 833-837. The silver nanowires having an average diameter of 75 nm and an average length of 35 μm were prepared, then the prepared silver nanowires were filtered using a ultrafiltration membrane followed by washing with water. Then, the silver nanowires were re-dispersed in ethanol to obtain a silver nanowire (Ag NW) dispersion (content of silver nanowires: 5 mass %).

(Preparation of First Electrode Unit TC-1)

A biaxial stretching polyethylene terephthalate (hereafter, it is called as PET) film was used as a mold-releasing substrate. After a corona discharge treatment was carried out on the surface of the aforesaid PET film, the silver nanowire dispersion was coated with an applicator so that the coating amount of the silver nanowire became 80 mg/m$^2$ and then it was dried. Thus, there was formed the first transparent resin component having a network structure made of silver nanowires.

Further, there was over coated a conductive polymer PEDOT (poly-3,4-ethyelenedioxythiophene)/PSS (polystyrene sulfonic acid) (Baytron PH510, made by H. C. Starck, Co., Ltd.) to the aforesaid network structure made of silver nanowires so that the dried thickness became 100 nm. Then it was dried and subjected to a thermal treatment at 80° C. for 3 hours. This was used as a transferring film containing Ag NW.

Then, on the biaxial stretching PET film (total optical transmittance: 90%) proved with a barrier layer and an adhesion assisting layer was coated a UV curable transparent resin liquid 1UA mentioned below so that the layer thickness to be 5 μm. Then the aforesaid transferring film containing Ag NW was pasted together. Subsequently, the first transparent resin component was fully cured by irradiating with UV rays. And then, by peeling off the PET film, which was a mold-releasing substrate, the layer formed on the transferring film containing Ag NW was transferred to the PET film. Thus, it was prepared the first electrode unit TC-1 of the present invention.

<UV Curable Transparent Resin Liquid 1UA>

Ltd; Mn=45,000, regioregular type, polymer p-type semiconductor material) and 1.0 mass % of PCBM indicated below (Mw=911, low molecular n type semiconductor material). Subsequently, the chlorobenzene solution was spin coated for 60 seconds at 500 rpm, then for 1 second at 2,200 rpm, while filtering with a 0.45 μm filter. After leaving the coating at room temperature for 30 minutes, it was heated at 120° C. for 30 minutes.

Next, the first electrode unit TC-1 on which was formed a series of the above-mentioned organic power generation layer unit was installed in a vacuum vapor-deposition apparatus. After having set the element so that a transparent electrode and the shadow mask of 2 mm width might cross at right angles, the inner portion of the vacuum vapor-deposition apparatus was decompressed to be below to $10^{-3}$ Pa. Then, there were vacuum-deposited lithium fluoride with a thickness of 5 nm and aluminium with a thickness of 80 nm with a vacuum-deposition rate of 2 nm/second. Thus, organic photoelectric conversion element STC-1 having a size of 2 mm square was obtained. On the surrounding of the cathode of the obtained organic photoelectric conversion element STC-1 was applied an adhesive agent except the edge portion so that

| | |
|---|---:|
| SP-1 (ADEKA Corporation) | 3 mass parts |
| EP-1 | 20 mass parts |
| OXT221 (di[1-ethyl(3-oxetanyl)]methyl ether, made by TOAGOSEI Co., Ltd.) | 40.4 mass parts |
| OXT212 (3-ethyl-3-(2ethylhexyloxymethy)oxetane, made by TOAGOSEI Co., Ltd.) | 25 mass parts |
| OXT101 (3-ethyl-3-hydroxymethyoxetane, made by TOAGOSEI Co., Ltd.) | 3 mass parts |
| Propylene carbonate | 3 mass parts |
| Triisopropanolamine | 0.1 mass parts |
| X-22-4272 (made by Shin-Etsu Silicone Co., Ltd.) | 0.5 mass parts |

SP-1

EP-1

Molecular weight: 380.48

[Preparation of Organic Photoelectric Conversion Element]

On the first electrode TC-1 was spin coated a conductive polymer PEDOT/PSS (Baytron P4083, made by H. C. Starck, Co., Ltd.) so that to form a thickness of 30 nm. Then it was heated to dry at 120° C. for 10 minutes in the air.

After this, the first electrode TC-1 which was provided with the above-mentioned conductive polymer layer was carried in into a glove box, and operation was made under the nitrogen atmosphere.

First, the above-mentioned first electrode TC-1 was heat-treated for 3 minutes at 120° C. under the nitrogen atmosphere. Next, there was prepared a chlorobenzene solution by dissolving 1.0 mass % of P3HT (made by Rike Metal, Co., the external taking out terminals of the anode and the cathode can be formed. After adhering a flexible sealing member which is mainly made of polyethylene terephthalate as a substrate to it, it was subjected to a heat treatment to harden the adhesive agent.

[Preparation of Organic Photoelectric Conversion Element STC-2]

(Preparation of First Electrode Unit TC-2)

The transparent first electrode unit TC-2 was prepared in the same manner as preparation of the above-described first electrode unit TC-1, except that a conductive polyaniline dispersion ORMECON D1033 containing a sulfonic acid dopant (made by ORMECON Co., Ltd.) was used instead of PEDOT/PSS.

[Preparation of Organic Photoelectric Conversion Element]

Organic photoelectric conversion element STC-2 was prepared in the same manner as preparation of the above-described organic photoelectric conversion element STC-1, except that the first electrode unit TC-1, which is the first electrode unit, was changed to the first electrode unit TC-2.

[Preparation of Organic Photoelectric Conversion Element STC-3]

(Preparation of First Electrode Unit TC-3)

The transparent first electrode unit TC-3 was prepared in the same manner as preparation of the above-described first electrode unit TC-1, except that a transparent inorganic component containing liquid B-1 mentioned below was used instead of PEDOT/PSS.

<Transparent Inorganic Component containing Liquid B-1>

| | |
|---|---|
| SnO$_2$ particles doped with Sb (made by ISIEHARA SANGYO KAISHA Ltd., solid content of 30%) | 160 g |
| Compound (UL-1) | 0.2 g |
| Modified aqueous polyester A solution (solid content of 18%) | 30 g |
| Water to make | 1,000 ml |

UL-1

<Preparation of Modified Aqueous Polyester A>

To a reaction vessel for polycondensation, there were put 35.4 weight parts of dimethyl terephthalate, 33.63 weight parts of dimethyl isophthalate, 17.92 weight parts of 5-sulfo-dimethyl isophthalate sodium salt, 62 weight parts of ethylene glycol, 0.065 weight part of calcium acetate monohydrate and 0.022 weight part of manganese acetate 4 water salts. After performing trans-esterification with removing methanol at 170 to 220° C. under a nitrogen gas flow, there were added 0.04 weight parts of trimethyl phosphate, 0.04 weight parts of antimony trioxide as a polycondensation catalyst and 6.8 weight parts of 1,4-cyclohexane dicarboxylic acid. At a reaction temperature of 220 to 235° C., almost all of the theoretical amount of water was removed to complete an esterification. Then, further, for about 1 hour, the inside of the reaction system was decompressed ant the temperature was increased. At a final stage, polycondensation was performed at 280° C. at 133 Pa or less for about 1 hour, and the precursor of modified aqueous polyester A was obtained. The intrinsic viscosity of the precursor was 0.33.

In a 2 L three necked flask equipped a stirrer, a condenser and a thermometer were charged with 850 ml of pure water. While rotating the stirrer, 150 g of the above-mentioned precursor was added gradually. After stirring for 30 minutes at room temperature, the mixture was heated so that the inner temperature became 98° C. over 1.5 hours, and heat melting was carried out at this temperature for 3 hours. After termination of the heating, the reaction mixture was cooled to room temperature over 1 hour, and it was left one night to prepare a solution whose solids concentration was 15 weight %.

In a 3 L four necked flask equipped a stirrer, a condenser, a thermometer and a dropping funnel were charged with 1,900 ml of the above-described precursor solution. While rotating the stirrer, the precursor solution was heated so that the inner temperature became 80° C. Into this was added 6.52 ml of a 24% aqueous ammonium persulfate solution. To this solution was dropped a monomer mixture (28.5 g of glycidyl methacrylates, 21.4 g of ethyl acrylate and 21.4 g of methyl methacrylates) for 30 minutes, and the reaction was continued for further 3 hours. Then, the reaction mixture was cooled to 30° C. or less and filtered to obtain a solution of modified aqueous polyester A whose solids concentration is 18 weight % (polyester component/acrylic component=80/20).

[Preparation of Organic Photoelectric Conversion Element STC-3]

Organic photoelectric conversion element STC-3 was prepared in the same manner as preparation of the above-described organic photoelectric conversion element STC-1, except that the first electrode unit TC-1, which is the first electrode unit, was changed to the first electrode unit TC-3.

[Preparation of Organic Photoelectric Conversion Element STC-4]

(Preparation of First Electrode Unit TC-4)

The transparent first electrode unit TC-4 was prepared in the same manner as preparation of the above-described first electrode unit TC-1, except that a transparent inorganic component containing liquid B-2 mentioned below was used instead of PEDOT/PSS.

(Preparation of Transparent Inorganic Component containing B-2)

| | |
|---|---|
| SnO$_2$ sol (Ceramase S-8, solid content of 8%, made by Taki Chemical, Co., Ltd.) | 160 g |
| Compound (UL-1) | 0.2 g |
| Modified aqueous polyester A solution (solid content of 18%) | 30 g |
| Water | to make 1,000 ml |

[Preparation of Organic Photoelectric Conversion Element]

Organic photoelectric conversion element STC-4 was prepared in the same manner as preparation of the above-described organic photoelectric conversion element STC-1, except that the first electrode unit TC-1, which is the first electrode unit, was changed to the first electrode unit TC-4.

[Preparation of Organic Photoelectric Conversion Element STC-5]

(Preparation of First Electrode Unit TC-5)

The transparent first electrode unit TC-5 was prepared in the same manner as preparation of the above-described first electrode unit TC-1, except that a liquid containing 3.0 mass % of MX150 (cross-linked PMMA, made by Soken Chemical & Engineering Co., Ltd.) and 1.2 mass % of PEDOT/PSS as a solid content in pure water was used instead of PEDOT/PSS so that to form a dried thickness of 175 nm.

[Preparation of Organic Photoelectric Conversion Element]

Organic photoelectric conversion element STC-5 was prepared in the same manner as preparation of the above-described organic photoelectric conversion element STC-1, except that the first electrode unit TC-1, which is the first electrode unit, was changed to the first electrode unit TC-5.

[Preparation of Organic Photoelectric Conversion Element STC-6]

(Preparation of First Electrode Unit Tc-6)

The transparent first electrode unit TC-6 was prepared in the same manner as preparation of the above-described first electrode unit TC-1, except that a liquid containing 3.0 mass % of MX150 (cross-linked PMMA, made by Soken Chemical & Engineering Co., Ltd.) and 1.2 mass % of PEDOT/PSS as a solid content in pure water was used instead of PEDOT/PSS so that to form a dried thickness of 450 nm.

[Preparation of Organic Photoelectric Conversion Element]

Organic photoelectric conversion element STC-6 was prepared in the same manner as preparation of the above-described organic photoelectric conversion element STC-1, except that the first electrode unit TC-1, which is the first electrode unit, was changed to the first electrode unit TC-6.

[Preparation of Organic Photoelectric Conversion Element STC-7]

(Preparation of First Electrode Unit TC-7)

A transferring film containing Ag NW was prepared in the same manner as preparation of the above described electrode TC-1.

Then, on the biaxial stretching PET film (total optical transmittance: 90%) proved with a barrier layer and an adhesion assisting layer was coated a UV curable transparent resin liquid 1UB mentioned below as a composition for the first transparent resin component so that the layer thickness of 1UB to be 5 μm. Then the aforesaid transferring film containing Ag NW was pasted together. Subsequently, the first transparent resin component was fully cured by irradiating with UV rays. And then, by peeling off the PET film, which was a mold-releasing substrate, the layer formed on the transferring film containing Ag NW was transferred to the PET film. Thus, it was prepared the first electrode unit TC-7 of the present invention.

<UV Curable Transparent Resin Liquid 1UB>

| | |
|---|---|
| SP-1 | 3 mass parts |
| EP-1 | 20 mass parts |
| MX150 (cross-linked PMMA) | 5 mass parts |
| OXT221 (di[1-ethyl(3-oxetanyl)]methyl ether, made by TOAGOSEI Co., Ltd.) | 40.4 mass parts |
| OXT212 (3-ethyl-3-(2ethylhexyloxytmethy)oxetane, made by TOAGOSEI Co., Ltd.) | 25 mass parts |
| OXT101 (3-ethyl-3-hydroxymethyoxetane, made by TOAGOSEI Co., Ltd.) | 3 mass parts |
| Propylene carbonate | 3 mass parts |
| Triisopropanolamine | 0.1 mass parts |
| X-22-4272 (made by Shin-Etsu Silicone Co., Ltd.) | 0.5 mass parts |

[Preparation of Organic Photoelectric Conversion Element]

Organic photoelectric conversion element STC-7 was prepared in the same manner as preparation of the above-described organic photoelectric conversion element STC-1, except that the first electrode unit TC-1, which is the first electrode unit, was changed to the first electrode unit TC-7.

ITO was vacuum-deposited on the biaxial stretching PET film (total optical transmittance: 90%) proved with a barrier layer under the condition that the average thickness was set to 150 nm. Thus the first electrode unit TC-8 was prepared. The haze value thereof was measured to be 12%.

[Preparation of Organic Photoelectric Conversion Element]

Organic photoelectric conversion element STC-8 was prepared in the same manner as preparation of the above-described organic photoelectric conversion element STC-1, except that the first electrode unit TC-1, which is the first electrode unit, was changed to the first electrode unit TC-8.

ITO was vacuum-deposited on the biaxial stretching PET film (total optical transmittance: 90%) proved with a barrier layer under the condition that the average thickness was set to 200 nm. The surface thereof was grinded so that the haze value became 6% and the first electrode unit TC-8 was prepared.

[Preparation of Organic Photoelectric Conversion Element]

Organic photoelectric conversion element STC-9 was prepared in the same manner as preparation of the above-described organic photoelectric conversion element STC-1, except that the first electrode unit TC-1, which is the first electrode unit, was changed to the first electrode unit TC-9.

<Evaluation of First Electrode Unit and Organic Photoelectric Conversion Element>

The above-described first electrodes unit and organic photoelectric conversion elements were subjected to the evaluations and measurements as described below.

[Measurement of Refractive Index]

The refractive indexes of the first transparent resin component, the second the first transparent resin component, and the transparent inorganic component which were used for producing the each first electrode were measured in accordance with the following method.

The independent film of the each ingredient was formed on a PET film, and by using Spectroscopic ellipsometer VASE (made by J. A. Woollam, Co., Ltd.), ellipsometry parameters φ (psi) and Δ (delta) were measured in the range of an incidence angle of 45 to 75° at an interval of 5°, and for the wavelength of 245 to 1,000 nm at an interval of 1.6 nm. The obtained data were analyzed using the analyzing software made by J. A. Woollam Co., Ltd. to obtain the refractive index. In addition, the refractive index obtained at 550 nm was used.

[Measurement of Haze Value]

With respect to the first electrode units TC-1 to TC-9 which were prepared as above, the average haze values EH1 and EH2 were measured using haze meter HGM-2B made by Suga Test Instruments Co., Ltd. Here, the average haze values EH1 and EH2 were obtained by slanting cutting the transparent electro conductive layer to make a surface and the average haze values EH1 and EH2 were obtained at the center portion of the film thickness.

[Measurement of Total Optical Transmittance]

The total optical transmittance of the produced organic photoelectric conversion elements were measured using haze meter HGM-2B made by Suga Test Instruments Co., Ltd. based on JIS K 7361-1: 1997.

[Measurement of Photoelectric Conversion Efficiency of Organic Photoelectric Conversion Element]

Each organic photoelectric conversion element was sealed using a glass sealing cap and a UV curing resin, and then it was irradiated with the light of a solar simulator (AM1.5G) under the condition of 100 mW/cm$^2$ strength. The voltage-electric current characteristics were measured, and the photoelectric conversion efficiency was obtained.

Each result obtained by the above mentioned way is shown in Table 1.

TABLE 1

Composition and Properties of the first electrode unit

| Organic photoelectric conversion element Number | Number | Metal nanowire | Refractive index of the first transparent resin component | Refractive index of the second transparent resin component or the transparent inorganic component | Production method | Haze value EH1 | Haze value EH2 | Total optical transmittance (%) | Photoelectric conversion efficiency | Remarks |
|---|---|---|---|---|---|---|---|---|---|---|
| STC-1 | TC-1 | Yes | 1.49 | 1.52 | Coating • Pasting | 2 | 11 | 83 | 2.14 | Present invention |
| STC-2 | TC-2 | Yes | 1.49 | 1.50 | Coating • Pasting | 2 | 11 | 81 | 2.14 | Present invention |
| STC-3 | TC-3 | Yes | 1.49 | 1.99 | Coating • Pasting | 2 | 16 | 86 | 2.08 | Present invention |
| STC-4 | TC-4 | Yes | 1.49 | 1.89 | Coating • Pasting | 2 | 14 | 85 | 2.01 | Present invention |
| STC-5 | TC-5 | Yes | 1.71 | 1.50 | Coating • Pasting | 2 | 19 | 86 | 2.26 | Present invention |
| STC-6 | TC-6 | Yes | 1.49 | 1.52 | Coating • Pasting | 2 | 29 | 85 | 2.31 | Present invention |
| STC-7 | TC-7 | Yes | 1.49 | 1.52 | Coating • Pasting | 15 | 11 | 83 | 1.98 | Present invention |
| STC-8 | TC-8 | None | 1.71 | 1.52 | Vacuum-depositing | 12 | — | 83 | — | Comparison |
| STC-9 | TC-9 | None | — | — | Vacuum-depositing | 6 | — | 86 | 1.64 | Comparison |

As is shown by the results described in Table 1, the organic photoelectric conversion element using the first electrode unit composed of the composition specified by the present invention has high photoelectric conversion efficiency compared with the comparative example. It was found that the following specific organic photoelectric conversion element exhibited the effects of the present invention more effectively. This specific organic photoelectric conversion element contains a first transparent resin component and a second transparent resin component which has a higher refractive index, and it has a structure in which: a content of the first transparent resin component is higher in the side near the transparent substrate; and the content of the second transparent resin component and the content of the metal nanowire are higher in the side near the organic power generation layer unit.

Example 2

<p-Type Semiconductor Material>

The following tetrabenzoporphyrin derivative was used as a p-type semiconductor material.

(BP-1)

<Preparation and Evaluation of Organic Photoelectric Conversion Elements STC-21 to STC-29>

Organic photoelectric conversion elements STC-21 to STC-29 were prepared in the same manner as preparation of the organic photoelectric conversion elements STC-1 to STC-9 described in Example 1, except that 1.0 mass % of P3HT (made by Rike Metal, Co., Ltd; Mn=45,000, regioregular type, polymer p-type semiconductor material) was replace with 12 mass % of the above-described BP-1.

Subsequently, the same evaluations as described in Example 1 were carried out to the organic photoelectric conversion elements STC-21 to STC-29 which were produced as mentioned above. As a result, it was confirmed that the same effects as listed in Table 1 were acquired with the organic photoelectric conversion elements of the present invention.

DESCRIPTION OF THE SYMBOLS

1: Metal nanowire
2: Transparent electro conductive material (Second transparent resin component or transparent inorganic component)
3: First transparent resin component
4: First electrode unit
A: Transparent electro conductive layer
10: Organic photoelectric conversion element of bulk heterojunction type
11: Transparent substrate
12: Transparent electrode
13: Counter electrode (Second electrode unit)
14, 16: Photoelectric conversion unit
15: Charge recombination layer

What is claimed is:

1. An organic photoelectric conversion element comprising a transparent substrate, a first electrode unit, an organic power generation layer unit, and a second electrode unit; the first electrode unit, the organic power generation layer unit, and the second electrode unit are successively arranged on the transparent substrate with the first electrode unit nearest to the transparent substrate; wherein the first electrode unit comprises at least two layers each containing a metal nanowire and a transparent electro-conductive material, and among the at least two layers containing a metal nanowire in the first electrode unit, the layer located nearest the transparent substrate has an average haze value of EH1, and the layer located nearest the organic power generation layer unit has an average haze value of EH2, wherein the average haze values satisfy the relationship of EH1 <EH2.

2. The organic photoelectric conversion element of claim 1, wherein the first electrode unit comprises a first transparent resin component, and a second transparent resin component which has a higher refractive index than the first electrode unit comprising two regions wherein the first transparent resin component is contained with a higher content in the region nearest the transparent substrate; and the second transparent resin component and the metal nanowire are contained with a higher content in the region nearest the organic power generation layer unit.

3. The organic photoelectric conversion element of claim 2, wherein the second transparent resin component is a transparent conductive polymer.

4. The organic photoelectric conversion element of claim 1, wherein the first electrode unit comprises a first transparent resin component, and a transparent inorganic component which has a higher refractive index than the first transparent resin component; the first electrode unit comprising two regions wherein the first transparent resin component is contained with a higher content in the region nearest the transparent substrate; and the transparent inorganic component and the metal nanowire are contained with a higher content in the region nearest the organic power generation layer unit.

5. The organic photoelectric conversion element of claim 4, wherein the transparent inorganic component is a transparent conductive metal oxide.

6. The organic photoelectric conversion element of claim 2, wherein a particle co-exists in a region where the first transparent resin component is located.

7. The organic photoelectric conversion element of claim 1, wherein the second electrode unit contains a metal compound as a constituting component of the second electrode unit.

* * * * *